(12) United States Patent
Matsuhashi

(10) Patent No.: US 6,809,380 B2
(45) Date of Patent: Oct. 26, 2004

(54) SEMICONDUCTOR DEVICE FORMED ON AN SOI STRUCTURE WITH A STRESS-RELIEF LAYER

(75) Inventor: Hideaki Matsuhashi, Saitama (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/600,827

(22) Filed: Jun. 23, 2003

(65) Prior Publication Data

US 2004/0075142 A1 Apr. 22, 2004

(30) Foreign Application Priority Data

Oct. 3, 2002 (JP) ........................................ 2002/290989

(51) Int. Cl.[7] .................. H01L 27/01; H01L 27/12; H01L 31/0392
(52) U.S. Cl. .................. 257/347; 257/506; 257/19
(58) Field of Search .................. 257/347, 506, 257/19

(56) References Cited

U.S. PATENT DOCUMENTS

| | | | | |
|---|---|---|---|---|
| 5,071,785 | A | * | 12/1991 | Nakazato et al. ............ 438/457 |
| 6,383,892 | B1 | * | 5/2002 | Colt, Jr. ...................... 438/457 |
| 6,645,796 | B2 | * | 11/2003 | Christensen et al. ......... 438/149 |
| 6,707,106 | B1 | * | 3/2004 | Wristers et al. .............. 257/347 |
| 2002/0094658 | A1 | * | 7/2002 | Swanson et al. ............. 438/416 |
| 2002/0164841 | A1 | * | 11/2002 | Assaderaghi et al. ........ 438/149 |
| 2002/0173123 | A1 | * | 11/2002 | Fogel et al. ................. 438/480 |
| 2002/0185675 | A1 | * | 12/2002 | Furukawa .................... 257/327 |
| 2002/0190318 | A1 | * | 12/2002 | Fox et al. .................... 257/347 |
| 2003/0008471 | A1 | * | 1/2003 | Norcott et al. .............. 438/400 |
| 2003/0124818 | A1 | * | 7/2003 | Luo et al. .................... 438/482 |

FOREIGN PATENT DOCUMENTS

JP          9-246556          9/1997

OTHER PUBLICATIONS

Cheng–Liang Huang et al., "LOCOS–Induced Stress Effects on Thin–Film SOI Devices", IEEE Electron Device Letters, vol. 44, No. 4, Apr. 1997, pp. 646–650.

* cited by examiner

Primary Examiner—Amir Zarabian
Assistant Examiner—Ida M. Soward
(74) Attorney, Agent, or Firm—Wenderoth, Lind & Ponack, L.L.P.

(57) ABSTRACT

A lower buried oxide film, a stress-relief film, an upper buried oxide film, and an SOI film are formed over a semiconductor substrate in this order. The thermal expansion coefficient of the stress-relief film is greater than the thermal expansion coefficient of the upper buried oxide film. The stress-relief film desirably has a thermal expansion coefficient equal to or greater than the thermal expansion coefficient of the SOI film. For example, it is formed of a silicon film, or of a composite film laminating a silicon film, a germanium film disposed thereon, and a silicon film disposed thereon. Accordingly, a semiconductor device having an SOI MOSFET is to be provided, which has excellent characteristics such as low parasitic capacitance and a small S value and is hardly affected by the stress generated by the difference between thermal expansion coefficients of the buried oxide film and the SOI film.

19 Claims, 4 Drawing Sheets

SEMICONDUCTOR DEVICE FORMED ON AN SOI STRUCTURE WITH A STRESS-RELIEF LAYER

BACKGROUND OF THE INVENTION

The present invention relates to a semiconductor device having a MOSFET (Metal-Oxide-Semiconductor Field-Effect Transistor) of an SOI (Silicon-On-Insulator) structure.

The problem in this type of traditional semiconductor device is described in the document below.

C. I. Huang et al., *LOCOS-Induced Stress Effects on Thin-Film SOI Devices*, IEEE ELECTRON DEVICE LETTERS, Vol. 44, No. 4, pp. 646–650, April 1997.

FIGS. 6A and 6B depict semiconductor devices having a MOSFET of a traditional SOI structure. FIG. 6A depicts a partially-depleted (PD) device, and FIG. 6B depicts a fully-depleted (FD) device. As shown in FIGS. 6A and 6B, these semiconductor devices have a semiconductor substrate 21, a buried oxide film (BOX film) 22 formed on the substrate 21, and an SOI film 25 formed thereon. A source and a drain 31 and a channel 27 of the MOSFET are formed on the SOI film 25, a gate insulating film 28 is formed thereon, and a gate electrode 29 is formed thereon. A sidewall 30 is formed on both sides of the gate electrode 29. In addition, this MOSFET is isolated from the other adjacent devices such as similar MOSFETs by a device isolation film 26.

The difference in the structure between the partially-depleted (PD) device and the fully-depleted (FD) device is the thickness tSOI of the SOI film 25. Generally, it is about 100 to 200 nm in the partially-depleted device, while a thin SOI film having a thickness of 50 nm or below is used in the fully-depleted device.

Because of the structural characteristics, the SOI (Silicon-On-Insulator) MOSFET has advantages such as small parasitic capacitance, no latchup, a low soft error rate, and relatively easy device isolation, attracting a keen interest in the probability of applications to a high-speed, low-power consumption LSI. Particularly, in the fully-depleted SOI device shown in FIG. 6B, a depleted layer formed under the gate reaches the buried oxide film 22 below the SOI film 25. Thus, the capacitance in the depleted layer becomes small, and a substhreshold factor (S value) is reduced to nearly a desired value. On this account, the MOSFET has the advantage that the threshold voltage (Vth) can be made smaller than that of a bulk device or the partially-depleted SOI device (FIG. 6A) when the same off leakage current is set.

SUMMARY OF THE INVENTION

However, the above-described document reports the result that the transconductance (gm) of the NMOSFET is more reduced in the 501 device than in the bulk device. This report is in the case of using LOCOS (Local Oxidation Of Silicon) for device isolation; the transconductance is greatly reduced as the oxide film is thicker. Inversely, in the PMOSFET, the transconductance is increased as the oxide film is thicker. This is because the oxide film (SiO2 film) in the device isolation region is expanded in volume to apply compressive stress to the SOI film. A reduction in the current value caused by the stress is nearly 40% at the maximum, and the merits of the SOI device are cancelled. Therefore, it is important to reduce the stress.

The paper reports that the stress in the device isolation region affects the transconductance to be reduced. However, the inventors observe the phenomenon that current is more reduced in the NMOSFET than in the bulk device whereas it is increased in the PMOSFET even in the case where the device isolation film is formed very thin to sufficiently reduce the stress applied from the device isolation region. The cause is considered to be the influence of the stress generated by the difference between the thermal expansion coefficients of Si and $SiO_2$ upon carrier mobility, which is considered to have small influence in the paper.

FIG. 7 schematically depicts the stress generated in a multilayer film. The thermal expansion coefficient of Si is $2.5 \times 10^{-6}/°$ C., and that of $SiO_2$ is $5 \times 10^{-7}/°$ C. When annealed at temperature that silicon oxide becomes viscous (at a temperature of around 1000° C.) in the fabrication process of the semiconductor device, Si and $SiO_2$ are in a flat state. The Si film is significantly contracted by the difference in thermal expansion coefficient in temperature drop from that temperature. Consequently, the multilayer film is warped downward as shown in the drawing, and thus the compressive stress is generated on the top side of the Si film.

The stress generated by the difference between the thermal expansion coefficients becomes greater as the ratio of the SOI film thickness to the BOX film thickness (the SOI film thickness/the BOX film thickness) is greater. On this account, the fully-depleted SOI device having a thin SOI layer tends to be affected greatly. When the BOX film is formed thinner, the influence of the stress generated by the difference between the thermal expansion coefficients is reduced. However, advantages such as low parasitic capacitance being the merit of the SOI device and a small S value in the fully-depleted SOI device are cancelled.

Then, the object of the invention is to provide a semiconductor device having a MOSFET of an SOI structure with such excellent characteristics as the semiconductor device is hardly affected by the stress generated by the difference between the thermal expansion coefficients of the BOX film and the SOI film and has low parasitic capacitance and a small S value.

A semiconductor device of the invention is characterized by having:

a lower buried oxide film disposed on a semiconductor substrate;

a stress-relief film disposed on the lower buried oxide film;

an upper buried oxide film disposed on the stress-relief film; and an SOI film disposed on the upper buried oxide film, wherein the SOI film is formed with a MOSFET having a source, a drain, and a channel, and a thermal expansion coefficient of the stress-relief film is greater than a thermal expansion coefficient of the upper buried oxide film.

The stress-relief film desirably has the thermal expansion coefficient nearly equal to or greater than the thermal expansion coefficient of the SOI film.

For example, the stress-relief film may be formed of a silicon film. Alternatively, it may be formed of a composite film laminating a first silicon film, a germanium film disposed thereon, and a second silicon film disposed thereon.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

Hereafter, embodiments of the invention will be described with reference to the accompanying drawings.

First Embodiment

Figure 1:
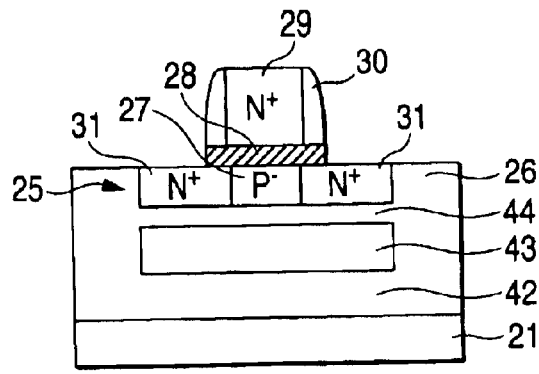
FIG. 1 is a cross-sectional view illustrating a semiconductor device of a first embodiment of the invention.

FIG. 1 is a cross-sectional view illustrating a semiconductor device of a first embodiment having a field-effect transistor (MOSFET) of an SOI (Silicon-On Insulator) structure.

The semiconductor device has a semiconductor substrate 21, a lower buried oxide film (BOX film) 42 disposed on the substrate 21, a stress-relief film 43 disposed thereon, an upper BOX film 44 disposed thereon, and an SOT film 25 disposed thereon. More specifically, it has the buried oxide film being an insulating layer and the SOI layer 25 being a semiconductor layer formed on the buried oxide film in which the stress-relief layer 43 is disposed a predetermined distance apart from the top of the buried oxide film contacting with the SOI layer 25 and through a part of the buried oxide film below the area to form semiconductor elements in the SOI layer 25.

The substrate 21 is formed of high-resistivity single crystal silicon. For example, the lower BOX film 42 and the upper BOX film 44 are formed of silicon oxide ($SiO_2$). The stress-relief film 43 is formed of a silicon film. In other words, it can be said that the stress-relief film 43 is formed of the same material as that of the SOI film 25. For example, the silicon film is formed of a crystal film, polycrystal film or amorphous film, not containing n-type and p-type impurities almost completely. That is, it is a non-doped film.

The SOI film 25 is formed with a source and a drain 31 and a channel 27 of the MOSFET. A gate insulating film 28 is disposed on the channel 27, and a gate electrode 29 is disposed thereon. A sidewall 30 is disposed on both sides of the gate electrode 29.

This MOSFET is isolated from the other adjacent devices such as similar MOSFETs by the device isolation film 26. For example, the device isolation film 26 is formed of silicon oxide ($SiO_2$), which is formed by STI (Shallow Trench Isolation).

The SOI MOSFET of the embodiment is a fully-depleted type. The film thickness of the SOI film 25 is about 50 nm, for example. The upper BOX film 44 interposed between the SOI layer 25 and the stress-relief layer 43 has a film thickness almost the same as that of the SOI film 25, about 50 nm, for example. The lower BOX film 42 is about several times thicker than the upper BOX film 44, about 150 nm, for instance. In addition, the film thickness of the stress-relief film 43 is almost the same as the film thickness of the lower BOX film 42, about 150 nm, for example. Furthermore, the stress-relief layer 43 is formed of the silicon film as described above, having almost the same thermal expansion coefficient as that of the SOI film 25.

Figure 6A:
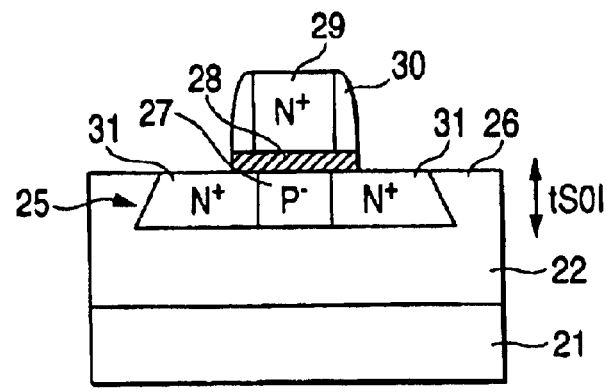
FIGS. 6A and 6B are cross-sectional views illustrating traditional semiconductor devices.
Figure 6B:
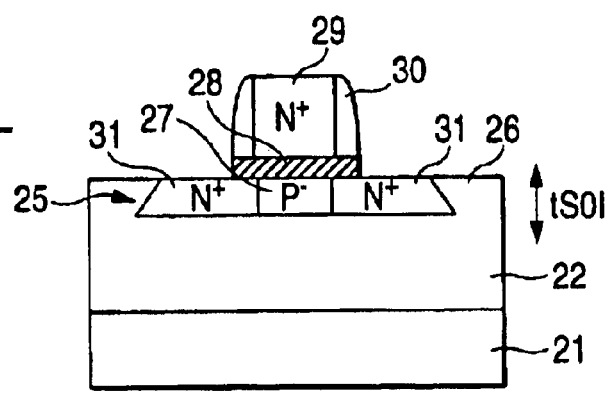

As described above, the structure of the embodiment is different from the traditional SOI MOSFET in that the BOX film (corresponding to 22 shown in FIG. 6) below the SOI layer 25 is separated into two layers (42 and 44) and the stress-relief film 43 formed of silicon (non-doped silicon) is inserted therebetween.

Figure 7:
FIG. 7 is a diagram illustrating the problem of the traditional semiconductor device.

As described above, in the traditional structure, the stress is applied to the SOI film by the difference between thermal expansion coefficients of the BOX film and the SOI film. In the embodiment, the stress-relief film 43 is disposed to suppress or prevent the downward warp as shown in FIG. 7. More specifically, the stress-relief film 43 has almost the same thermal expansion coefficient as that of the SOI film 25, and it is contracted by the same extent as the SOI film 25 with temperature drop from the temperature that silicon oxide becomes viscous. Therefore, when only the upper BOX film 44 and the stress-relief film 43 are disposed, the multilayer film is warped upward. In a three-layer structure as the embodiment in which the SOI film 25 and the stress-relief film 43 are disposed above and below the upper BOX film 44 so as to sandwich it, to be warped downward or upward is determined by the thermal expansion coefficient and thickness of the SOI film 25 on the upper side and the stress-relief film 43 on the lower side. As described above, in the embodiment, the thermal expansion coefficients of the SOI film 25 and the stress-relief film 43 are almost the same, and thus it is determined only by the thickness. This three-layer structure will be warped upward because the stress-relief film 43 on the lower side is thicker in the embodiment. Actually, it is not as easy as described above, because there are other layers including the lower BOX film 42 in addition to the three layers and there is the influence of the device isolation film 26. However, it is apparent that the SOI film and the thick BOX film disposed thereunder can suppress the tendency to be warped downward more than the traditional structure can. Consequently, the tendency of the SOI film 25 to be warped downward is suppressed in this manner. Therefore, reductions in the SOI MOSFET characteristics caused by the stress can be suppressed.

In order to enhance the effect to suppress the tendency of the SOI film to be warped downward as described above, it is fine to increase the thermal expansion coefficient and thickness of the stress-relief film 43.

As described above, since the stress applied to the SOI film 25 is reduced as the stress-relief film 43 is thicker, it is fine that the stress-relief film 43 is as thick as possible from this point. On the other hand, when it is too thick, etching becomes difficult in the later process (in forming the device isolation film by STI). Then, the film thickness of the stress-relief film 43 is formed nearly equal to the film thickness of the lower BOX film.

Moreover, the upper BOX film 44 is formed thinner to reduce the stress which is applied to the SOI film 25 and the stress-relief film 43 because the thermal expansion coefficient of the upper BOX film 44 is smaller than that of the SOI film 25 or stress-relief film 43. The reduced stress is shared by the SOI film 25 and the stress-relief film 43; the ratio is greater in the thicker stress-relief film 43. In the meantime, the lower BOX film 42 is relatively thick to generate a great stress because the thermal expansion coefficient is relatively small. However, most of the stress is applied to the stress-relief film 43, and hardly applied to the SOI film 25.

In addition, because of the existence of the lower BOX film 42, the parasitic capacitance of the source and drain to the substrate can be serial capacitances of parasitic capacitances of the upper BOX film 44 and the lower BOX film 42. Therefore, the same parasitic capacitance can be formed as that in the case where the BOX film having the thickness combining the upper BOX film 44 and the lower BOX film 42 exists. Furthermore, according to the semiconductor device in the embodiment, the stress-relief layer 43 is disposed at a desired position in the buried oxide film below the SOI layer where semiconductor elements such as MOS transistors are formed. Thus, it is also possible that the film thickness of the lower BOX layer 42 below the stress-relief layer 43 is formed thick sufficiently while the influence of the stress upon the SOI layer is suppressed to the minimum. More specifically, the total film thickness of the BOX film separating the semiconductor substrate 21 from the SOI layer 25 can be formed thick. Consequently, the parasitic capacitance of the semiconductor device can be further reduced, and an SOI device having excellent characteristics can be realized.

Moreover, the stress-relief film 43 is formed of the non-doped film to eliminate the extended depleted layer under the gate to terminate in the SOI film 25 (to operate as the partially-depleted device). Therefore, a fully-depleted SOI device can be formed.

As described above, the stress-relief film 43 formed of the non-doped silicon layer is inserted into the BOX layer below the SOI layer in the SOI MOSFET. Therefore, an SOI MOSFET of high driving force with no increase in parasitic capacitances and a reduced stress can be realized.

Hereafter, a fabrication method of the semiconductor device will be described with reference to FIGS. 2A to 2E and 3A to 3D.

Figure 2A:
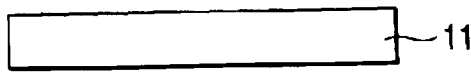
FIGS. 2A to 2E are diagrams illustrating the process steps of a fabrication method of the semiconductor device of the first embodiment.
Figure 2B:
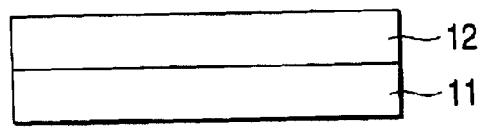

First, a semiconductor substrate 11 is prepared (FIG. 2A). The semiconductor substrate 11 is a p-type single crystal silicon wafer, for example. Subsequently, an epitaxial layer 12 formed of a p⁻-layer is formed on the surface of the semiconductor substrate 11 by epitaxy (FIG. 2B). In this case, the film thickness of the epitaxial layer 12 is 10 micrometers, for example.

Figure 2C:
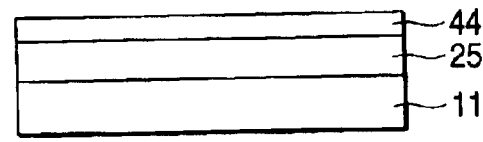

Then, the surface of the epitaxial layer 12 is oxidized to form a silicon oxide film 44 (FIG. 2C). This silicon oxide film 44 is used as the upper BOX film 44 later; the film thickness is about 50 nm, for example. In the epitaxial layer 12, an unoxidized portion 25 is left as the silicon layer, and this portion is used as the SOI film 25 later.

Figure 2D:
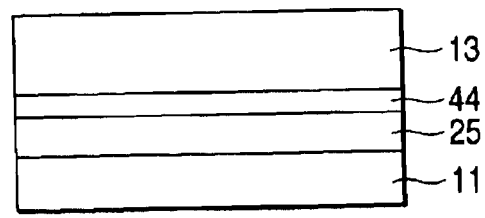

After that, a non-doped polysilicon film 13 is formed on the surface of the silicon oxide film 44 by CVD (FIG. 2D). The thickness of the polysilicon film 13 is about 230 nm, for example.

Figure 2E:
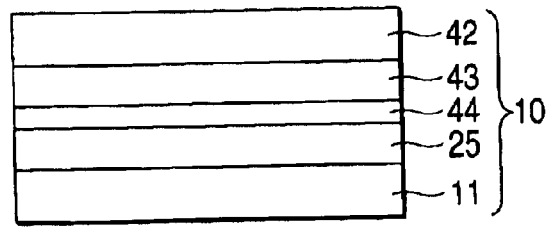

Subsequently, the surface of the polysilicon film 13 is oxidized to form a silicon oxide film 42 (FIG. 2E). This silicon oxide film 42 is used as the lower BOX film 42 later; the film thickness is about 150 nm, for example. In the polysilicon film 13, an unoxidized portion (about 150 nm) 43 is left as the polysilicon layer, and this portion is used as the stress-relief film 43 later.

Accordingly, a semiconductor substrate (bonding substrate) 10 for forming devices of the SOI substrate is formed.

Figure 3A:
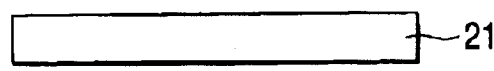
FIGS. 3A to 3D are diagrams illustrating the process steps of the fabrication method of the semiconductor device of the first embodiment.

In addition to the bonding substrate, a base semiconductor substrate 21 is prepared (FIG. 3A).

The base semiconductor substrate 21 is a p-type single crystal silicon wafer, for example, having the same conductivity type as that of the semiconductor substrate 11 of the semiconductor substrate for forming devices.

Figure 3B:
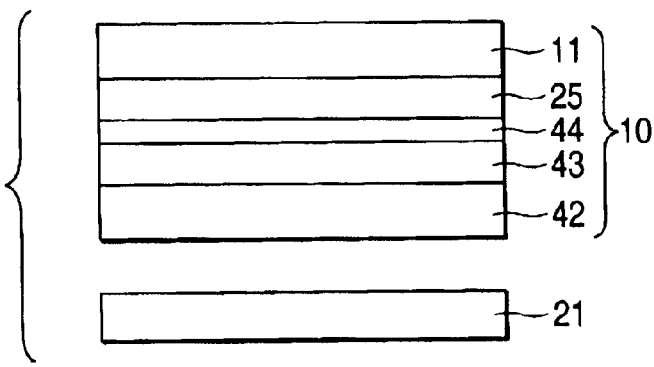

Then, the surface of the base semiconductor substrate 21 and the surface of a silicon oxide film 16 of the bonding substrate 10 formed of the semiconductor substrate 11 are placed face to face and brought into intimate contact with each other. Subsequently, they are annealed by an annealing method (for example, at a temperature of around 1000° C.), brought into intimate contact, and bonded to each other (FIG. 3B).

Figure 3C:
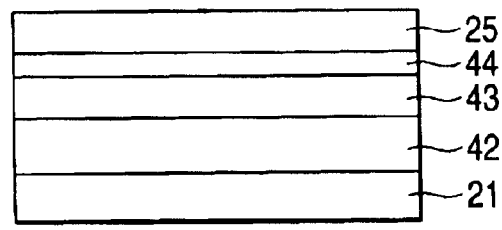

After that, the semiconductor substrate 11 is polished and removed from the backside of the bonded bonding substrate 10 (from the top side in FIG. 3B) by a polishing method, and the epitaxial layer 25 is polished to have a desired thickness (for example, about 50 nm). Therefore, the SOI substrate is completed (FIG. 3C).

Figure 3D:
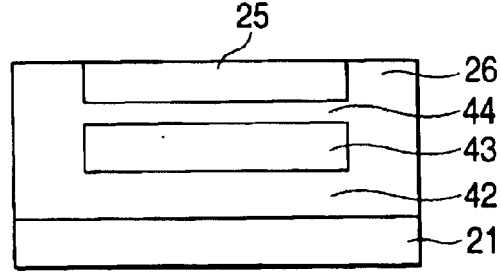

Then, in a predetermined area of the epitaxial layer 25 of the SOI substrate thus formed, a device isolation insulating film 26 formed of a silicon oxide film, for example, is formed by STI (FIG. 3D). It is acceptable that the trench formed by STI has a depth reaching only the stress-relief film 43 (a depth reaching the stress-relief film 43 but not reaching the lower BOX film 42), or has a depth reaching the lower BOX film 42 as shown in the drawing.

Subsequently, a gate insulating film 28, a gate electrode 29, and a sidewall 30 are formed over the surface of the epitaxial layer 25 by known methods.

Then, an n-type impurity such as phosphorus (P) is implanted into the epitaxial layer 25 by ion implantation. Subsequently, a thermal diffuser is used to thermally diffuse the n-type impurity for forming an n-type semiconductor region 31 to be the source and drain of the N-channel MOSFET (FIG. 1).

After that, an insulating film, a plug, and a wiring layer, not shown, are formed over the SOI substrate. Accordingly, the semiconductor device is completed.

As described above, in the MOSFET of the SOI structure of the embodiment, the SOI film 25 is formed on the upper BOX film 44 relatively thin, and the stress-relief film 43 having a thermal expansion coefficient grater than that of the upper BOX film 44 is disposed thereunder. Consequently, the tendency of the SOI film 25 to be warped downward is suppressed to reduce the stress applied to the top of the SOI film 25 (the stress generated by the difference between thermal expansion coefficients of silicon forming the SOI film and silicon oxide forming the BOX film). Therefore, a reduction in mobility in the NMOSFET caused by the stress can be suppressed, and an SOI MOSFET of high driving force can be formed.

Furthermore, in the embodiment, the stress-relief film 43 is formed of polysilicon, but it may be formed of amorphous silicon or crystalline silicon. (There is no great difference between polysilicon and amorphous silicon. Amorphous silicon is turned to be polysilicon in the process of annealing.) of the silicon film and has almost the same thermal expansion coefficient as that of the SOI film 25 as described above. However, it is further acceptable that the thermal expansion coefficient of the stress-relief film 43 is greater than the thermal expansion coefficient of the SOI film 25. It is more effective in suppressing the tendency of the SOI film 25 to be warped downward because the upper BOX film 44 has a relatively low thermal expansion coefficient.

Second Embodiment

Figure 4:
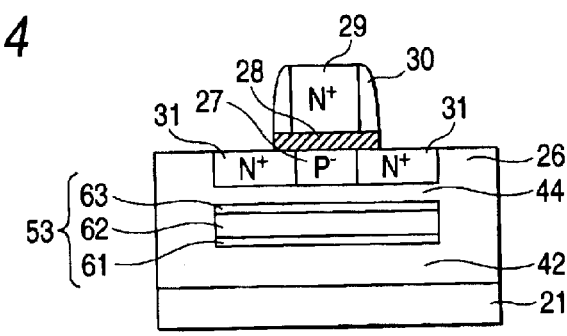
FIG. 4 is a cross-sectional view illustrating a semiconductor device of a second embodiment of the invention.

FIG. 4 is a schematic cross-sectional view illustrating the structure of an SOI MOSFET of a second embodiment of the invention.

The configuration of the embodiment is nearly equal to the first embodiment, but a composite film (multilayer film)

53 of a silicon (Si) film/germanium (Ge) film/silicon (Si) film (Si), not doped, is used as the stress relief film instead of the polysilicon film 43 in the first embodiment.

More specifically, the composite film 53 is formed of a lower silicon film 61, a germanium film 62 disposed thereon, and an upper silicon film 63 disposed thereon. The germanium film 62 is thicker than each of the upper silicon film 63 and the lower silicon film 61. For example, the film thickness of the lower silicon film 61 is about 20 nm, the film thickness of the germanium film 62 is about 100 nm, and the film thickness of the upper silicon film 63 is about 20 nm. The total thickness of the composite film is about 140 nm, which is nearly equal to the film thickness of the lower BOX film 42 (about 150 nm).

The upper and lower silicon films 61 and 63 are formed of a crystal film, polycrystal film, or amorphous film, not containing n-type and p-type impurities almost completely. In addition, the upper and lower silicon films 61 and 63 are thinner than the germanium film 62. In the second embodiment using the germanium film 62 as a film to relax the stress in the SOI layer, the stress-relief layer 53 disposed in the buried oxide film can be configured of a single layer of the germanium film. However, when the composite layer of disposing the silicon films 61 and 63 above and below the germanium film 62 is formed, the composite layer can desirably enhance the contact to the buried oxide film formed of a silicon oxide film, for example, and can reduce phase boundary potential generated in the interface between the buried oxide films 42 and 44 and the germanium film 62.

A fabrication method of the semiconductor device of the second embodiment is nearly equal to the fabrication method of the semiconductor device of the first embodiment, but the process steps of fabricating the stress-relief film 53 are varied.

Hereafter, the fabrication method of the semiconductor device of the second embodiment will be described with reference to FIGS. 5A to 5C. The semiconductor device of the second embodiment can be fabricated as almost similar to the first embodiment. First, as similar to the first embodiment described with reference to FIGS. 2A to 2C, a multi-layer structure is obtained in which an epitaxial layer 25 is disposed on a substrate 11 and a silicon oxide film 44 is disposed thereon (FIG. 2C).

Figure 5A:
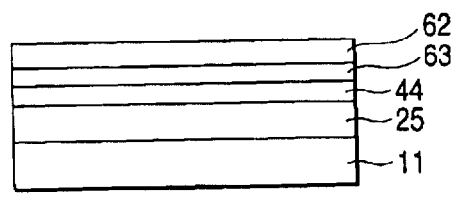
FIGS. 5A to 5C are diagrams illustrating the process steps of a fabrication method of the semiconductor device of the second embodiment.

Then, a polysilicon film 63 is first formed on the silicon oxide film 44 by CVD, and a germanium film 62 is formed thereon (FIG. 5A). In the embodiment, it is desirable that the film thickness of the germanium film 62 forming the stress-relief layer 53 is formed as thick as possible to allow the influence of the stress upon the SOI layer 25 to be suppressed. It is because the film thickness of the germanium film having a greater thermal expansion coefficient than that of the silicon film forming the SOI layer 25 is made thick to allow the much more stress to be applied to the germanium film 62 of the stress-relief layer 53 for relaxing the stress applied to the SOI layer 25. Here, for example, the film thickness of the polysilicon film 63 is about 20 nm, and the film thickness of the germanium film 62 is about 100 nm.

Figure 5B:
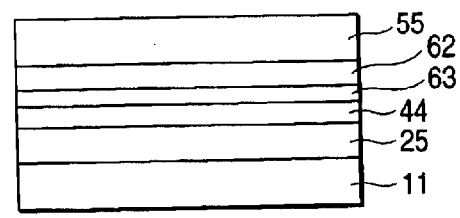

Subsequently, a polysilicon film 55 is formed on the germanium film 62 by CVD (FIG. 5B). Here, the film thickness of the polysilicon film 55 is about 170 nm, for example.

Figure 5C:
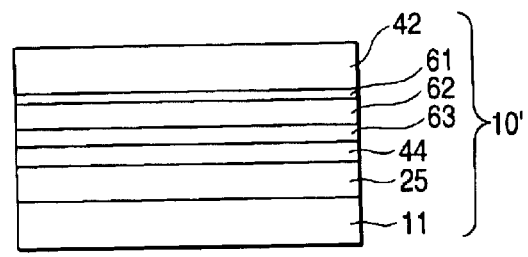

Then, the polysilicon film 55 is oxidized to form a silicon oxide film to be a lower BOX film 42 (FIG. 5C). The silicon oxide film 42 is used as the lower BOX film 42 later; the film thickness is about 150 nm, for example. In the polysilicon film 55, an unoxidized portion 61 is used as the polysilicon film 61 later; the film thickness is about 20 nm, for example.

As similar to the first embodiment described with reference to FIG. 3B or later, a bonding substrate 10' thus formed is bonded to a base substrate 21 to form an SOI substrate. Devices including MOSFETs are formed as similar to the first embodiment, and therefore the semiconductor device is completed.

The thermal expansion coefficient of germanium is 5.8× $10^{-6}$/° C., greater than that of silicon. Accordingly, the tendency of the SOI film 25 to be warped downward can be further reduced, and the stress applied to the SOI film 25 is made much smaller. Therefore, a reduction in carrier mobility in the NMOSFET caused by the stress can be further suppressed, and an SOI MOSFET of high driving force can be obtained.

As described above, according to the invention, the tendency of the SOI film to be warped downward caused by the difference between the thermal expansion coefficients of the SOI film and the BOX film can be suppressed. Therefore, the semiconductor device having the MOSFET of the SOI structure can be obtained, which has such excellent characteristics as the semiconductor device is hardly affected by the stress generated by the difference between thermal expansion coefficients of the BOX film and the SOI film and has low parasitic capacitance and a small S value.

Furthermore, when the thermal expansion coefficient of the stress-relief film is nearly equal to or greater than the thermal expansion coefficient of the SOI film, the influence of the upper BOX film having a relatively small thermal expansion coefficient can be further reduced. More specifically, the tendency of the SOI film to be warped downward caused by the upper BOX film having a relatively small thermal expansion coefficient can be further suppressed.

What is claimed is:

1. A semiconductor device comprising:
   a semiconductor substrate;
   a lower buried oxide film disposed on the semiconductor substrate;
   a stress-relief film disposed on the lower buried oxide film;
   an upper buried oxide film disposed on the stress-relief film; and
   an SOI film disposed on the upper buried oxide film,
   wherein the SOI film is formed with a MOSFET having a source, a drain, and a channel,
   wherein a thermal expansion coefficient of the stress-relief film is greater than a thermal expansion coefficient of the upper buried oxide films,
   wherein the upper buried oxide film has almost a same film thickness as that of the SOI film, and
   wherein the lower buried oxide film is thicker than the upper buried oxide film.

2. The semiconductor device according to claim 1, wherein the stress-relief film is formed of a silicon film.

3. The semiconductor device according to claim 2, wherein the silicon film is formed of a crystal film, polycrystal film, or amorphous film, and the silicon film is a non-doped silicon film.

4. The semiconductor device according to claim 1, wherein the stress-relief film is formed of a composite film laminating a first silicon film, a germanium film disposed on the first silicon film, and a second silicon film disposed on the germanium film.

5. The semiconductor device according to claim 4, wherein the first and second silicon films of the composite film are formed of a crystal film, polycrystal film, or amorphous film, and the silicon film is a non-doped silicon film.

6. The semiconductor device according to claim 4, wherein the first and second silicon films of the composite film are thinner than the germanium film of the composite film.

7. A semiconductor device comprising:

a semiconductor substrate;

a lower buried oxide film disposed on the semiconductor substrate;

a stress-relief film disposed on the lower buried oxide film;

an upper buried oxide film disposed on the stress-relief film; and an SOI film disposed on the upper buried oxide film, wherein the SOI film is formed with a MOSFET having a source, drain and a channel, wherein a thermal expansion coefficient of the stress-relief film is greater than a thermal expansion coefficient of the upper buried oxide film, and wherein the thermal expansion coefficient of the stress-relief film is nearly equal to or greater than a thermal expansion coefficient of the SOI film.

8. A semiconductor device comprising:

a semiconductor substrate;

an insulating layer formed on the semiconductor substrate;

a semiconductor layer disposed on the insulating layer;

a semiconductor element formed on the semiconductor layer; and a stress-relief layer having a thermal expansion coefficient greater than a thermal expansion coefficient of the insulating layer, wherein the stress-relief layer is disposed as a part of the insulating layer, wherein a film thickness of the insulating layer interposed between the semiconductor layer and the stress-relief layer is almost the same as a film thickness of the semiconductor layer, and wherein a film thickness of the insulating layer interposed between the semiconductor substrate and the stress-relief layer is greater than the film thickness of the insulating layer interposed between the semiconductor layer and the stress-relief layer.

9. The semiconductor device according to claim 8, wherein the thermal expansion coefficient of the stress-relief layer is nearly equal to or greater than a thermal expansion coefficient of the semiconductor layer.

10. The semiconductor device according to claim 9, wherein the semiconductor layer and the stress-relief layer are formed of a same material.

11. The semiconductor device according to claim 10, wherein the semiconductor layer and the stress-relief layer are formed of a silicon film.

12. The semiconductor device according to claim 11, wherein the silicon film is any one of a non-doped single crystal silicon film, non-doped polysilicon film, or non-doped amorphous silicon film.

13. The semiconductor device according to claim 8, wherein the stress-relief layer includes a germanium film.

14. The semiconductor device according to claim 13, wherein the stress-relief layer is configured of a composite film formed of the germanium film, a first silicon film disposed on the germanium film and contacting with the semiconductor layer, and a second silicon film disposed below the germanium film.

15. The semiconductor device according to claim 7, wherein the stress-relief film and the SOI film are formed of a same material.

16. The semiconductor device according to claim 7, wherein the stress-relief film is formed of silicon.

17. The semiconductor device according to claim 16, wherein the silicon is non-doped silicon.

18. The semiconductor device according to claim 7, wherein the upper buried oxide film has almost a same film thickness as that of the SOI layer.

19. The semiconductor device according to claim 7, wherein the lower buried oxide film is thicker than the upper buried oxide film.

* * * * *